United States Patent
Lee et al.

(10) Patent No.: US 10,435,869 B2
(45) Date of Patent: Oct. 8, 2019

(54) SPATIAL-TEMPORAL COMPRESSION OF SENSING DATA FOR SENSOR NETWORK

(71) Applicant: NAVITAS SOLUTIONS, INC., Hillsborough, NJ (US)

(72) Inventors: Inseop Lee, Pittstown, NJ (US); Minkyu Lee, Ringoes, NJ (US); Jaesik Lee, Basking Ridge, NJ (US); Andrew M. Chon, Princeton, NJ (US)

(73) Assignee: Navilas Solutions, Inc., Hillsborough, NJ (US)

( * ) Notice: Subject to any disclaimer, the term of this patent is extended or adjusted under 35 U.S.C. 154(b) by 0 days.

(21) Appl. No.: 15/850,734

(22) Filed: Dec. 21, 2017

(65) Prior Publication Data

US 2018/0183460 A1 Jun. 28, 2018

Related U.S. Application Data

(60) Provisional application No. 62/437,839, filed on Dec. 22, 2016.

(51) Int. Cl.
| | |
|---|---|
| H04L 29/06 | (2006.01) |
| E02F 9/26 | (2006.01) |
| E02F 3/42 | (2006.01) |
| H03M 7/30 | (2006.01) |
| H03M 13/00 | (2006.01) |
| E02F 3/34 | (2006.01) |
| H04W 28/06 | (2009.01) |

(52) U.S. Cl.
CPC ............ *E02F 9/26* (2013.01); *E02F 3/3405* (2013.01); *E02F 3/422* (2013.01); *E02F 9/264* (2013.01); *H03M 7/3062* (2013.01); *H03M 13/6312* (2013.01); *H03M 13/6588* (2013.01); *H04L 69/04* (2013.01); *E02F 3/34* (2013.01); *H04W 28/06* (2013.01)

(58) Field of Classification Search
CPC .... E02F 9/26; E02F 3/34; E02F 3/422; H04L 69/04; H03M 13/6312; H03M 7/3062; H03M 13/6588; H04W 28/06
USPC .......................... 375/240; 382/156; 340/572
See application file for complete search history.

(56) References Cited

U.S. PATENT DOCUMENTS

| | | | |
|---|---|---|---|
| 9,506,776 B2 * | 11/2016 | Alzate Perez | H04W 4/70 |
| 2006/0232416 A1 * | 10/2006 | Bauch | H04B 7/0669 |
| | | | 340/572.7 |
| 2015/0139537 A1 * | 5/2015 | Milner | G06K 9/4604 |
| | | | 382/156 |
| 2018/0115725 A1 * | 4/2018 | Zhang | H04N 5/3745 |

\* cited by examiner

*Primary Examiner* — Chieh M Fan
*Assistant Examiner* — Fitwi Y Hailegiorgis
(74) *Attorney, Agent, or Firm* — Fox Rothschild LLP; Robert J. Sacco; Carol E. Thorstad-Forsyth

(57) ABSTRACT

Spatial-temporal compression of sensing data from a plurality of sensors involves using a plurality of sensors to obtain measured physical data associated with a plurality of sensed elements. At each of a plurality of sampling times a set of N sampled data is acquired from the N sensed elements corresponding to the measured physical data. The sets of sampled data are analyzed to obtain statistical characteristic information. Thereafter, one or more frames of compressed data is generated using the statistical characteristic information to facilitate temporal and spatial data compression.

19 Claims, 12 Drawing Sheets t₀ data

|  | Binary | | | Hex | Decimal |
|---|---|---|---|---|---|
| D₀(1) = | 1110 | 1011 | 1101 | 0xEBD | 3773 |
| D₀(2) = | 1110 | 1011 | 1110 | 0xEBE | 3774 |
| D₀(3) = | 1110 | 1011 | 1110 | 0xEBE | 3774 |
| D₀(4) = | 1110 | 1011 | 1101 | 0xEBD | 3773 |
| D₀(5) = | 1110 | 1011 | 1110 | 0xEBE | 3774 |
| D₀(6) = | 1110 | 1100 | 0100 | 0xEC4 | 3780 |
| D₀(7) = | 1110 | 1011 | 1101 | 0xEBD | 3773 |
| D₀(8) = | 1110 | 1011 | 1101 | 0xEBD | 3773 |
| D₀(9) = | 1110 | 1011 | 1011 | 0xEBB | 3771 |
| D₀(10) = | 1110 | 1011 | 1011 | 0xEBB | 3771 |
| D₀(11) = | 1110 | 1011 | 1011 | 0xEBB | 3771 |
| D₀(12) = | 1110 | 1011 | 1011 | 0xEBB | 3771 | t₁ data

|  | Binary | | | Hex | Decimal |
|---|---|---|---|---|---|
| D₁(1) = | 1110 | 1011 | 1101 | 0xEBD | 3773 |
| D₁(2) = | 1110 | 1011 | 1101 | 0xEBD | 3773 |
| D₁(3) = | 1110 | 1100 | 0000 | 0xEC0 | 3776 |
| D₁(4) = | 1110 | 1011 | 1101 | 0xEBD | 3773 |
| D₁(5) = | 1110 | 1011 | 1101 | 0xEBD | 3773 |
| D₁(6) = | 1110 | 1100 | 0100 | 0xEC4 | 3780 |
| D₁(7) = | 1110 | 1011 | 1101 | 0xEBD | 3773 |
| D₁(8) = | 1110 | 1011 | 1101 | 0xEBD | 3773 |
| D₁(9) = | 1110 | 1011 | 1101 | 0xEBD | 3773 |
| D₁(10) = | 1110 | 1011 | 1011 | 0xEBB | 3771 |
| D₁(11) = | 1110 | 1011 | 1011 | 0xEBB | 3771 |
| D₁(12) = | 1110 | 1011 | 1011 | 0xEBB | 3771 |

*FIG. 6A* t₂ data

| | Binary | | | Hex | Decimal |
|---|---|---|---|---|---|
| $D_2(1) =$ | 1110 | 1011 | 1101 | 0xEBD | 3773 |
| $D_2(2) =$ | 1110 | 1011 | 1101 | 0xEBD | 3773 |
| $D_2(3) =$ | 1110 | 1011 | 1110 | 0xEBE | 3774 |
| $D_2(4) =$ | 1110 | 1011 | 1101 | 0xEBD | 3773 |
| $D_2(5) =$ | 1110 | 1011 | 1101 | 0xEBD | 3773 |
| $D_2(6) =$ | 1110 | 1100 | 0011 | 0xEC3 | 3779 |
| $D_2(7) =$ | 1110 | 1011 | 1101 | 0xEBD | 3773 |
| $D_2(8) =$ | 1110 | 1011 | 1101 | 0xEBD | 3773 |
| $D_2(9) =$ | 1110 | 1011 | 1101 | 0xEBD | 3773 |
| $D_2(10) =$ | 1110 | 1011 | 1011 | 0xEBB | 3771 |
| $D_2(11) =$ | 1110 | 1011 | 1011 | 0xEBB | 3771 |
| $D_2(12) =$ | 1110 | 1011 | 1101 | 0xEBD | 3773 | t₃ data

| | Binary | | | Hex | Decimal |
|---|---|---|---|---|---|
| $D_3(1) =$ | 1110 | 1011 | 1101 | 0xEBD | 3773 |
| $D_3(2) =$ | 1110 | 1011 | 1101 | 0xEBD | 3773 |
| $D_3(3) =$ | 1110 | 1100 | 0000 | 0xEC0 | 3776 |
| $D_3(4) =$ | 1110 | 1011 | 1101 | 0xEBD | 3773 |
| $D_3(5) =$ | 1110 | 1011 | 1101 | 0xEBD | 3773 |
| $D_3(6) =$ | 1110 | 1100 | 0100 | 0xEC4 | 3780 |
| $D_3(7) =$ | 1110 | 1011 | 1101 | 0xEBD | 3773 |
| $D_3(8) =$ | 1110 | 1011 | 1101 | 0xEBD | 3773 |
| $D_3(9) =$ | 1110 | 1011 | 1011 | 0xEBB | 3771 |
| $D_3(10) =$ | 1110 | 1011 | 1011 | 0xEBB | 3771 |
| $D_3(11) =$ | 1110 | 1011 | 1011 | 0xEBB | 3771 |
| $D_3(12) =$ | 1110 | 1011 | 1101 | 0xEBD | 3773 |

FIG. 6B t₄ data

| | Binary | | | Hex | Decimal |
|---|---|---|---|---|---|
| D₄(1) = | 1110 | 1011 | 1101 | 0xEBD | 3773 |
| D₄(2) = | 1110 | 1011 | 1110 | 0xEBE | 3774 |
| D₄(3) = | 1110 | 1011 | 1110 | 0xEBE | 3774 |
| D₄(4) = | 1110 | 1011 | 1101 | 0xEBD | 3773 |
| D₄(5) = | 1110 | 1011 | 1101 | 0xEBD | 3773 |
| D₄(6) = | 1110 | 1100 | 0011 | 0xEC3 | 3779 |
| D₄(7) = | 1110 | 1011 | 1101 | 0xEBD | 3773 |
| D₄(8) = | 1110 | 1011 | 1110 | 0xEBE | 3774 |
| D₄(9) = | 1110 | 1011 | 1011 | 0xEBB | 3771 |
| D₄(10) = | 1110 | 1011 | 1011 | 0xEBB | 3771 |
| D₄(11) = | 1110 | 1011 | 1010 | 0xEBA | 3770 |
| D₄(12) = | 1110 | 1011 | 1011 | 0xEBB | 3771 | t₅ data

| | Binary | | | Hex | Decimal |
|---|---|---|---|---|---|
| D₅(1) = | 1110 | 1011 | 1101 | 0xEBD | 3773 |
| D₅(2) = | 1110 | 1011 | 1101 | 0xEBD | 3773 |
| D₅(3) = | 1110 | 1100 | 0000 | 0xEC0 | 3776 |
| D₅(4) = | 1110 | 1011 | 1101 | 0xEBD | 3773 |
| D₅(5) = | 1110 | 1011 | 1101 | 0xEBD | 3773 |
| D₅(6) = | 1110 | 1100 | 0100 | 0xEC4 | 3780 |
| D₅(7) = | 1110 | 1011 | 1101 | 0xEBD | 3773 |
| D₅(8) = | 1110 | 1011 | 1101 | 0xEBD | 3773 |
| D₅(9) = | 1110 | 1011 | 1011 | 0xEBB | 3771 |
| D₅(10) = | 1110 | 1011 | 1011 | 0xEBB | 3771 |
| D₅(11) = | 1110 | 1011 | 1011 | 0xEBB | 3771 |
| D₅(12) = | 1110 | 1011 | 1011 | 0xEBB | 3771 |

*FIG. 6C* t₆ data

|  | Binary | | | Hex | Decimal |
|---|---|---|---|---|---|
| $D_6(1) =$ | 1110 | 1011 | 1101 | 0xEBD | 3773 |
| $D_6(2) =$ | 1110 | 1011 | 1101 | 0xEBD | 3773 |
| $D_6(3) =$ | 1110 | 1011 | 1110 | 0xEBE | 3774 |
| $D_6(4) =$ | 1110 | 1011 | 1101 | 0xEBD | 3773 |
| $D_6(5) =$ | 1110 | 1011 | 1101 | 0xEBD | 3773 |
| $D_6(6) =$ | 1110 | 1100 | 0100 | 0xEC4 | 3780 |
| $D_6(7) =$ | 1110 | 1011 | 1101 | 0xEBD | 3773 |
| $D_6(8) =$ | 1110 | 1011 | 1101 | 0xEBD | 3773 |
| $D_6(9) =$ | 1110 | 1011 | 1011 | 0xEBB | 3771 |
| $D_6(10) =$ | 1110 | 1011 | 1011 | 0xEBB | 3771 |
| $D_6(11) =$ | 1110 | 1011 | 1011 | 0xEBB | 3771 |
| $D_6(12) =$ | 1110 | 1011 | 1011 | 0xEBB | 3771 |

SPATIAL-TEMPORAL COMPRESSION OF SENSING DATA FOR SENSOR NETWORK

The present application claims benefit of U.S. Provisional Patent Application No. 62/437,839, filed on Dec. 22, 2016 and entitled "SPATIAL-TEMPORAL COMPRESSION OF SENSING DATA FOR SENSOR NETWORKING," the contents of which are incorporated by reference in its entirety.

BACKGROUND

Statement of the Technical Field

The technical field of this disclosure comprises sensor networks, such as a sensor network used for a battery management system (BMS), and in particular concerns techniques for transmission and reception of sensory data from a plurality of sensor nodes.

Description of the Related Art

The amount of sensory data, number of nodes, sensing rate, communication reliability and power consumption of sensor devices are major design factors to consider when developing a sensor network. Among these factors, the amount of sensory data is among the most critical of factor which must be considered because many of the other factors are derivative or determined based on the amount of sensory data. For example, if the amount of sensory data is known, then the maximum number of nodes and sensing rate that can be supported in a particular scenario can be calculated. Also, power consumption of active devices which are necessary to facilitate data transmission can be estimated. The maximum number of data retransmissions allowed for reliable communication is also determined based on the amount of data which needs to be sent.

Data compression techniques are widely used in signal processing and data communication. There are two types of data compression, lossless compression and lossy compression. Lossless compression is suitable for data communication and data storage. Lossy compression is often used for video processing, image processing, audio processing, and speech processing.

SUMMARY

This disclosure concerns methods and systems for spatial-temporal compression of sensing data from a plurality of sensors. The method involves using a plurality of N sensors to respectively obtain measured physical data associated with a plurality of N sensed elements. According to one aspect, the sensed elements can be battery cells in one or more battery banks. The method involves acquiring at each of a plurality of sampling times a set of N sampled data from the N sensed elements corresponding to the measured physical data. The sets of N sampled data acquired at the plurality of sampling times are subsequently analyzed in a statistics estimator to obtain statistical characteristic information for one or more of the sets of N sampled data. The statistical characteristics obtained by the statistics estimator can comprise one or more characteristics selected from the group consisting of minimum, mean, and median data values. The statistical characteristics can further comprise special status information for a sensed element.

After the statistic characteristics have been determined, at least one frame of compressed data is obtained by using the statistical characteristic information. More particularly this information is used to facilitate temporal and spatial data compression of the N sampled data acquired at the plurality of sampling times. According to one aspect, at least one of the temporal and spatial data compression comprises a differential encoding of the sensed data. For example, the differential encoding can comprise reference-based differential block coding (RDBC).

The method also involves communicating the at least one frame of compressed data to a remote data receiver. At the data receiver, the data can be decompressed to recover the N sampled data obtained from each of the plurality of sampling times. In those scenarios where the sensed elements are battery cells, the measured physical data can include one or more of battery voltage, temperature, and current data. Further, the remote data receiver can comprise a battery management unit configured to monitor a status of the plurality of battery cells by tracking a status of the battery voltage, temperature and/or current data.

BRIEF DESCRIPTION OF THE DRAWINGS

Embodiments will be described with reference to the following drawing figures, in which like numerals represent like items throughout the figures, and in which:

FIGS. 6A-6D (collectively FIG. 6) is a set of tables showing data sets used in a data compression example discussed herein.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

Data compression techniques are widely used in signal processing and data communication. There are two types of data compression, lossless compression and lossy compression. Lossless compression is suitable for data communication and data storage. Lossy compression is often used for video processing, image processing, audio processing, and speech processing. For data compression system disclosed herein, temporal and spatial information are used. Temporal information can be obtained by analyzing the data from the same source at different time slots. Meanwhile, spatial compression utilizes the correlation between the data from different sources at the same time slot.

Figure 1:
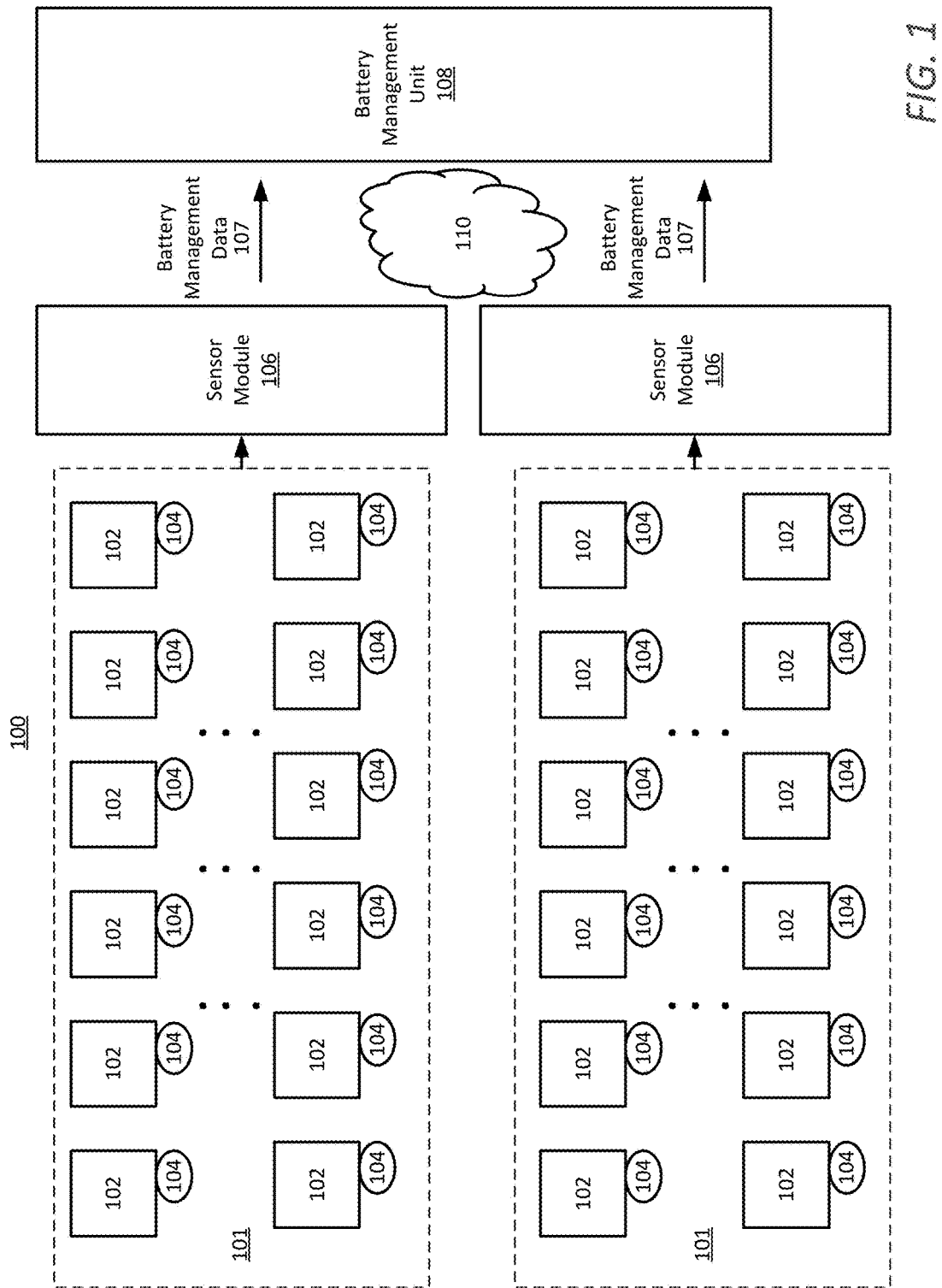
FIG. 1 is a block diagram that is useful for understanding a battery management system.

A battery management system (BMS) 100 is shown in FIG. 1, the system is comprised of one or more battery banks 101, each comprising a plurality of N battery cells 102 having at least one associated sensor 104. Digital data from the plurality of sensors 102 is respectively communicated to one or more sensor modules 106. The data can be communicated from the sensors 102 to the sensor modules 106 by any suitable method, including wired and/or wireless data links. Only two battery banks 101 and sensor modules 106 are shown in FIG. 1, but it should be understood that more or fewer banks and sensor modules are possible. The sensor modules 106 can use temporal characteristics and/or spatial characteristics of the measured data to facilitate lossless compression and encoding. The compressed and encoded battery management data 107 is communicated from the sensor module 106 to a battery management unit (BMU) 108. For example, a wired or wireless data network 110 can be used for communicating such data.

In BMS system 100, measured voltage data of N battery cells 102 acquired by N sensors 104 at a predetermined sampling rate will have both temporal and spatial information. To understand this concept, consider that at sampling time t0, N sampled data from N battery cells 102 are available. At time t1, another set of N sampled data are available. By analyzing the correlation of sampled data for a particular cell at two or more different times (e.g., t0 and t1) of a particular cell 102, temporal information can be obtained. Also, by analyzing N sampled data from N cells at a certain time slot, spatial information for the BMS 100 is obtained.

Figure 2:
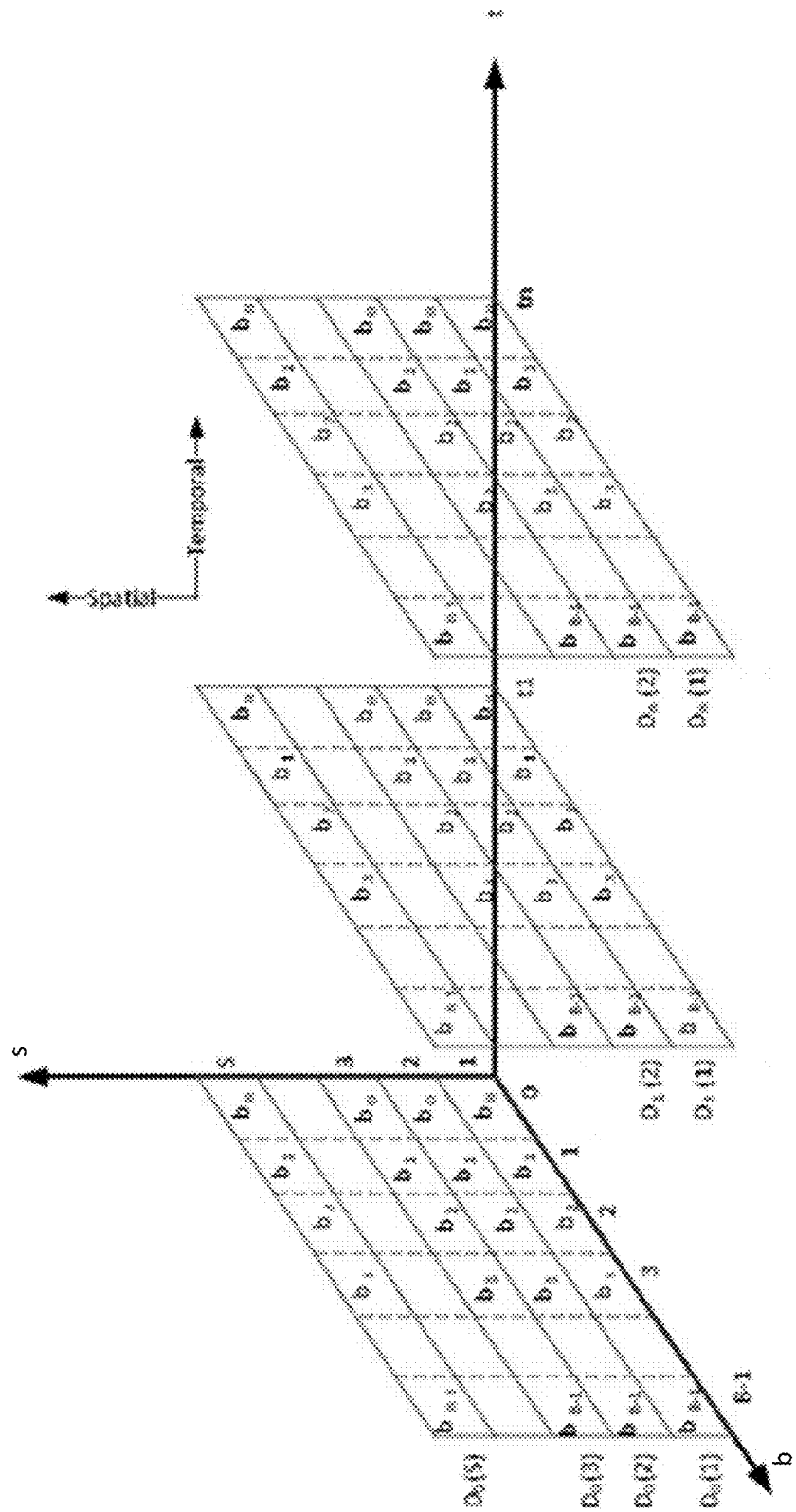
FIG. 2 is a spatial-temporal domain representation of sampled data in sensor network.

Generalization of the method mentioned above to any sensor network data is depicted in FIG. 2, where axis t represents time corresponding to a series of time slots $t_0, t_1, \ldots t_n$ associated with a sampling period, axis s corresponds to the number of sensing entities, and axis b is the assigned bits for a sampled data. The data can be represented as $$D_n(s) = b_{B-1} b_{B-2} \ldots b_1 b_0$$

where D is a binary representation of sensory data, n is the sampling time index, s is the index for sensing device, b is a binary value of sensory data, and B is number of bits assigned to D. With sampling rate of $T_s$ ms, sampling time index n represents time slot of $n*T_s$ ms. So, as an example, if an output of 12 bit Analog to Digital Converter (ADC) of sensor #3 at sampling time 100 ms with sampling rate 50 ms is "101011001001", then $D_n(s)$ becomes $D_2(3)=101011001001$.

Figure 3:
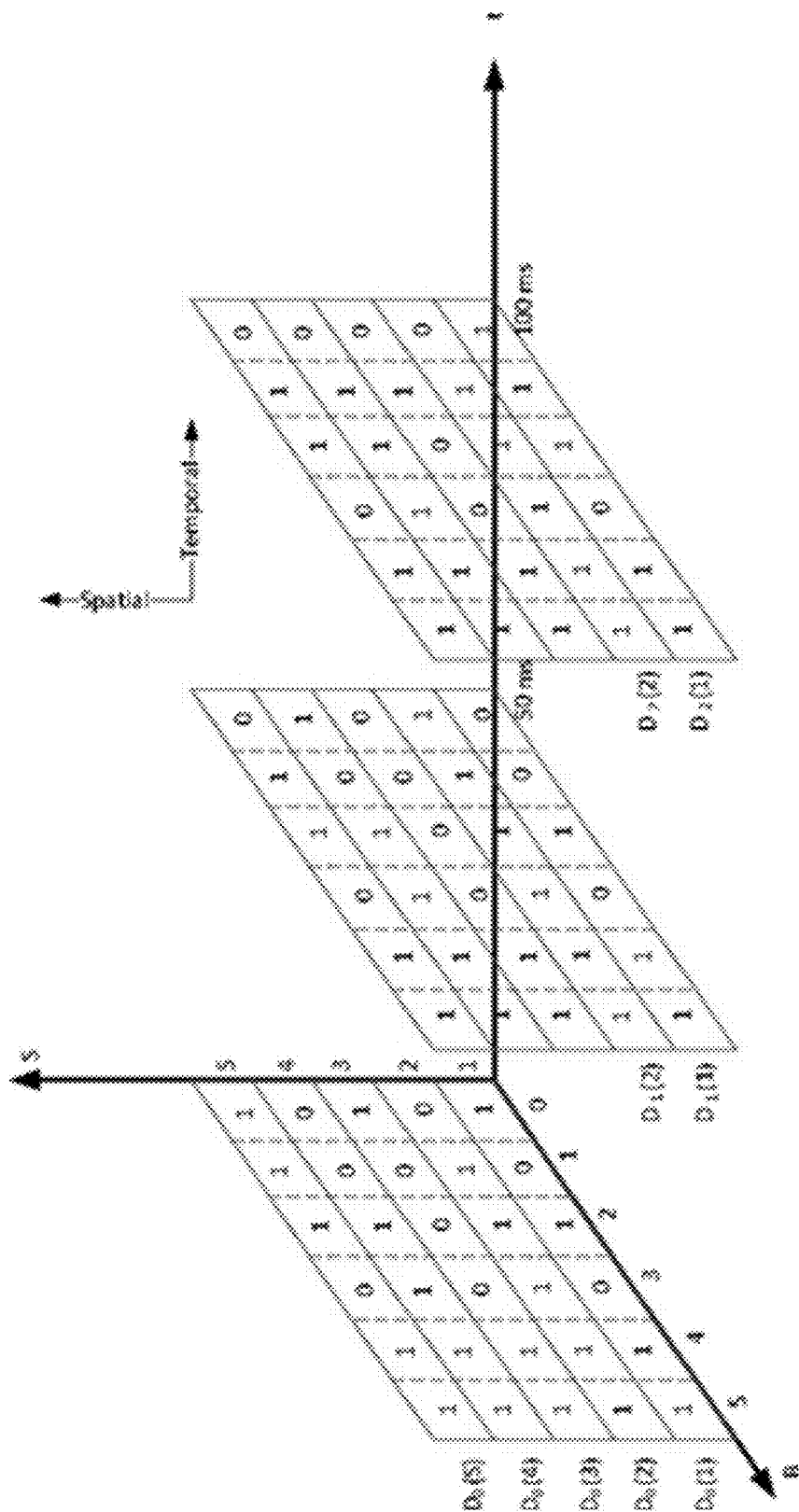
FIG. 3 is an example representation of spatial-temporal data.

A further example is shown below with reference to FIG. 3. For the purposes of this example it is assumed that data from a BMS consists of 5 battery cells, a 6 bit ADC, and a sampling rate ($T_s$) of 50 ms, then s becomes s=1, 2, 3, 4, 5 and B is 6. At t=0 ms, 50 ms and 100 ms, each sensing data can be represented as follows:

t=0 ms $D_0(1)=110101$
$D_0(2)=111100$
$D_0(3)=110001$
$D_0(4)=111100$
$D_0(5)=110111$
t=50 ms $D_1(1)=110100$
$D_1(2)=111111$
$D_1(3)=110000$
$D_1(4)=111101$
$D_1(5)=110110$
t=100ms $D_2(1)=110111$
$D_2(2)=111110$
$D_2(3)=110010$
$D_2(4)=111110$
$D_2(5)=110110$

Spatial domain represents collection of data from all sensors at a certain sampling time, while temporal domain represents collection of data from certain sensor at different sampling points. In the scenario described above with respect to FIG. 2, an example of spatial domain data at sampling time 0 ms are t=0 ms $D_0(1)=110101$
$D_0(2)=111110$
$D_0(3)=110001$
$D_0(4)=111100$
$D_0(5)=110111$ Temporal domain data from a sensor #2 are
$D_0(2)=111100$
$D_1(2)=111111$
$D_2(2)=111110$ Since $D_n(s)$ is digitized sensory data of natural properties, such as voltage, current, temperature, pressure, and moisture, temporal domain characteristics are somewhat predictable under normal operating conditions. More particularly, if a sampling interval is of sufficiently short duration to represent behavior of natural properties, then differences of adjacent samples from a particular sensor are limited to a small range in most cases. In other words, variation of temporal domain characteristics of $D_n(s)$ are gradual.

In general, spatial domain characteristics of $D_n(s)$ in a system cannot be characterized as temporal domain because the types of sensors in a system are not necessarily the same. However, sensory data from a BMS in the case of multiple batteries is a special case. BMS for EV (Electric Vehicle) and ESS (Energy Storage System) consists of tens or hundreds of batteries. Voltage, current and temperature sensors are installed in a system to monitor the status of each battery. Since one of the main function of a BMS is to keep the voltage level of each battery cells in an allowable range, the BMS will read voltage levels of each cell at a given sampling rate. In such a scenario, variation of sampled values of spatial domain data of $D_n(s)$ is limited to a small range during normal operation (e.g., when battery conditions are nominal).

Consequently, in a BMS scenario as described herein, temporal and spatial domain characteristics can be used to facilitate lossless data compression. Advantageously, such lossless data compression can substantially reduce the amount of data to be transmitted from a BMS sensor module to a BMS management unit module. The foregoing concept is illustrated in FIG. 4, which is useful for understanding a general flow of BMS data encoding and decoding.

Figure 4:
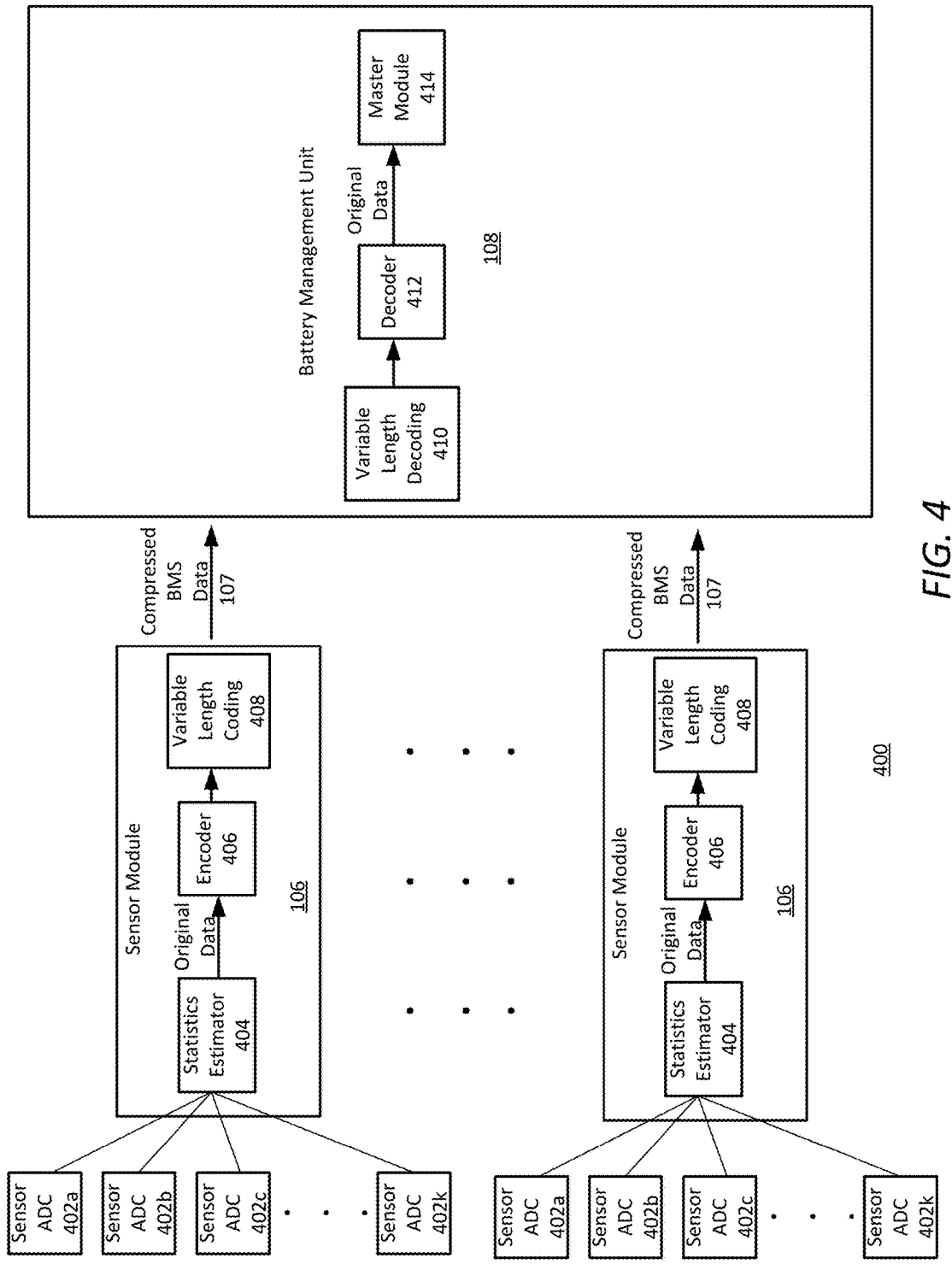
FIG. 4 is a process flow diagram that is useful for understanding a general flow of data compression in a sensor network.

As shown in FIG. 4, a battery management system 400 includes a plurality of sensor modules 106 which each respectively receive sensed data from a plurality of sensor ADCs 402a . . . 402k. The sensor ADCs are respectively associated with a plurality of sensors (e.g., sensors 104). The sensor ADCs communicate captured sensor data to a sensor module (e.g., sensor modules 106). In each sensor module 106, the data is encoded and compressed before being communicated to a BMU (e.g., BMU 108).

In a sensor module 106, statistics estimator 404 receives raw battery data from the plurality of battery sensor ADCs 400a-400k. The statistics estimator 404 uses the received input data to facilitate extraction of certain statistical characteristics of the input data. Such statistical characteristics can include, for each reported sensor parameter, certain characteristics such as minimum, maximum, mean, median values, and special status information. As used herein, special status information pertaining to battery cells can include information indicating an unusual or abnormal condition in a cell. For example, such information can comprise a condition in which sensed data for a cell is outside of a predetermined range which is considered normal for that cell. Based on these statistical characteristics, a data compression rate is automatically determined and encoding takes place in lossless encoder block 406. In some scenarios, the encoder block 406 can employ a spatial/temporal differential encoding scheme, referred to herein as "Reference-based Differential Block Coding (RDBC)". The RDBC encoding scheme is described below in greater detail.

The description of RDBC provided herein is for illustration only and shall not be understood as restricting the coding method which can be used in encoder block 406. Various other types of encoding methods can also be used provided that they facilitate lossless encoding using spatial and temporal characteristics of the data. All such coding methods now known or known in the future are contemplated for potential use in block 406.

In general, differential coding uses the difference between samples to reduce dynamic range of encoded data. In this way, a smaller number of bits are required to encode the difference compared to the number of bit for raw data encoding. RDBC encodes data as a group, a group can be samples of spatial domain, temporal domain, or spatial/temporal domain. Since the compression ratio used can be different for each frame of data, VLC (Variable Length Coding) can be used to minimize total size of transmission information. Also, to handle special cases (e.g. special status information) such as cell over-voltage (OV) or under-voltage (UV) conditions, extra information may be required in a particular frame. Data frame structure for purposes of the various embodiments can be any format but should include information comprising frame size, a reference value, and differences.

As used herein, the term "data frame" can refer to a defined unit of digital data which is transmitted periodically from a sensor module to a control module. More particularly, the data frame can include defined set of data features consisting of a sequence of bits or symbols that are transmitted from a sending unit to a receiver unit. As such, the data frame can include symbols or bits which specify the beginning, and end of the payload data within the stream of symbols or bits. In the context of the present disclosure, a data frame as disclosed herein can comprise a sequence of compressed and encoded battery sensor data which is transmitted from a BMS sensor module to a BMS control module. Data frames can be communicated over a network, which in some cases may be an embedded network that is part of a larger system (e.g., a vehicle).

Figure 5:
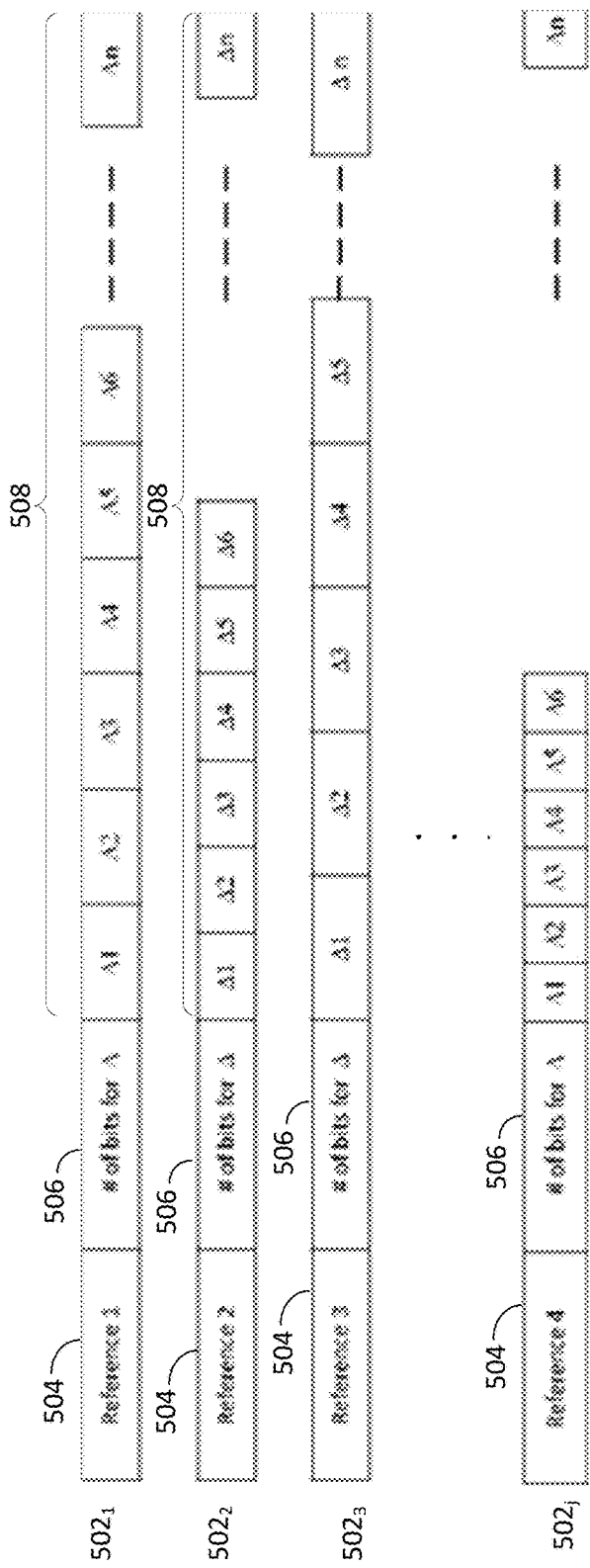
FIG. 5 is an example of a frame structure which can be used for communicating sensor data.

An example of a frame structure is shown in FIG. 5. The exact frame structure used in the various embodiments disclosed herein is not considered critical. Accordingly, the frame structure shown in FIG. 5 should be understood to be merely one possible arrangement of a frame structure that is provided to facilitate an understanding of the various embodiments. In a scenario disclosed herein, each one of a plurality of frames $502_1 \ldots 502_j$ may have variable length. For example, such a variable length can be facilitated in scenarios where the number of bits assigned to represent each of the difference value $\Delta 1, \Delta 2, \lambda 3, \ldots \Delta n$ is different for every frame. It can be observed in FIG. 5 that each frame $502_1 \ldots 502_j$ can include a reference or identifier value 504, a frame size field 506, and a set of difference values 508.

Examples of difference values 508 which are determined using temporal and spatial compression are discussed below in further detail.

Temporal and spatial RDBC for a battery management system can be explained with an example. Assume a scenario in which sampled data from 12 sensors is periodically collected at a sensing interval such that data is collected at times $t_0, t_2, \ldots t_i$. For this example, further assume that each sensor comprises a 12 bit ADC. Given the foregoing, a set of data for times $t_0$-$t_6$ are as set forth in FIGS. 6A-6D (collectively referred to herein as FIG. 6). In FIG. 6, sampled values are represented in binary, hexadecimal and decimal formats for convenience. It will be appreciated that for each sample time $t_0, t_2, \ldots t_i$ communication of the data set to a BMU 108 in binary format (and without compression) would involve transmission of 12 bits×12 sensors=144 bits.

For purposes of reducing the amount of data which must be communicated, one option would involve spatial RDBC. We select the minimum value present in the t0 data set as a reference for $D_0(1) \sim D_0(12)$. With reference to FIG. 6, we can observe that the minimum, $D_{min}$ in this group is $D_0(min) = 1110\ 1011\ 1011$ (0xEBB, 3771).

(where 1110 1011 1011 is the value in binary format, 0xEBB is the value in hexadecimal format, and 3771 is the value in decimal format). With this value selected as the reference value, the differential encoded values $\Delta$ are easily calculated and shown below in binary format with decimal values show in parentheses (i.e., binary (decimal))

$\Delta_0(1) = D_0(1) - D_0 (min) = 0010\ (2)$
$\Delta_0(2) = D_0(2) - D_0 (min) = 0011\ (3)$
$\Delta_0(3) = D_0(3) - D_0 (min) = 0011\ (3)$
$\Delta_0(4) = D_0(4) - D_0 (min) = 0010\ (2)$
$\Delta_0(5) = D_0(5) - D_0 (min) = 0010\ (3)$
$\Delta_0(6) = D_0(6) - D_0 (min) = 1001\ (9)$
$\Delta_0(7) = D_0(7) - D_0 (min) = 0010\ (2)$
$\Delta_0(8) = D_0(8) - D_0 (min) = 0010\ (2)$
$\Delta_0(9) = D_0(9) - D_0 (min) = 0000\ (0)$
$\Delta_0(10) = D_0(10) - D_0 (min) = 0000\ (0)$
$\Delta_0(11) = D_0(11) - D_0 (min) = 0000\ (0)$
$\Delta_0(12) = D_0(12) - D_0 (min) = 0000\ (0)$.

In this example, necessary information that is required at the receiving node are Do (min) and differential encoded values $\Delta_0(1) \ldots \Delta_0(12)$. By simply adding Do (min) to each of the differential encoded values $\Delta_0(1) \ldots \Delta_0(12)$, it is possible to reconstruct $D_0(1) \ldots D_0(12)$ without information loss. It may be noted that the resulting data compression ratio of this example is (12+48)/144. Accordingly, in this scenario more than 50% reduction of bandwidth can be achieved.

A second possible option for data compression would be temporal RDBC, with the following data:

|  | Binary |  |  | (Hex, Decimal) |
|---|---|---|---|---|
| $D_0(1) =$ | 1110 | 1011 | 1101 | (0xEBD, 3773) |
| $D_1(1) =$ | 1110 | 1011 | 1101 | (0xEBD, 3773) |
| $D_2(1) =$ | 1110 | 1011 | 1101 | (0xEBD, 3773) |
| $D_3(1) =$ | 1110 | 1011 | 1101 | (0xEBD, 3773) |
| $D_4(1) =$ | 1110 | 1011 | 1101 | (0xEBD, 3773) |
| $D_5(1) =$ | 1110 | 1011 | 1101 | (0xEBD, 3773) |
| $D_6(1) =$ | 1110 | 1011 | 1101 | (0xEBD, 3773) |

In this example, difference values (shown below) which are calculated for all successive samples following the initial sample $D_0(1)$ are zeroes. Accordingly, required information at a receiving end is the initial code $D_0(1)$ and differences, $A_0(1) \ldots A_6(1)$, $A_0(1) = D_0(1) - D_1(1) = 0 \ (0)$
$A_1(1) = D_1(1) - D_2(1) = 0 \ (0)$
$A_2(1) = D_2(1) - D_3(1) = 0 \ (0)$
$A_3(1) = D_3(1) - D_4(1) = 0 \ (0)$
$A_4(1) = D_4(1) - D_5(1) = 0 \ (0)$
$A_5(1) = D_5(1) - D_6(1) = 0 \ (0)$ Data compression ratio in this case is (12+6)/(12*7)=18/84, which is much higher than spatial differential coding in this example. However, error propagation is a very critical issue in temporal differential coding. If there is a transmission error, successive data cannot be recovered until a new initial code is received. To overcome the error propagation issue, special algorithm, e.g. retransmission of data, is required.

As shown in these examples, any value can potentially be a reference for purposes of RDBC. However, such reference value is advantageously selected to achieve the best data compression ratio with a given implementation complexity limitation. Minimum and successive samples are chosen as a reference in these examples, but the reference value could instead be a maximum, median, or mean value. Also, differential coding can be applied to a group of samples in temporal, spatial domain, or mix of spatial and temporal domains. Also, it should be appreciated that in these examples, a simple subtraction is given as a differential encoding algorithm, but any differential encoding algorithm can be used to maximize a data compression ratio.

More particularly, the difference values 508 within a communication frame $502_1 \ldots 502_j$ can be obtained using spatial compression, temporal compression, or a combination of spatial and temporal compression. The type of data compression utilized in a particular scenario can depend on the particular type of system from which data is being collected and the characteristics of data. For example, if a particular system can tolerate missing data (e.g., missing data due to communication failure and/or latency from measuring time), then temporal compression can be suitable. In some scenarios, the temporal compression approach can be utilized by itself, but other scenarios it can be advantageous to combine such temporal compression with spatial compression.

If a combination of spatial and temporal compression are used, the temporal compression is advantageously applied to the data set first. Spatial compression can then be applied to the output of the temporal compression algorithm.

The compression methodology (spatial, temporal or a combination of the two) can be fixed for a particular system. In such a scenario, a system designer can determine at design time (empirically or based on experimentation) which compression method (spatial, temporal, both) provides the highest compression ratio while still achieving lossless data transmission. However, it can be advantageous in certain scenarios to instead make decisions on a frame by frame basis concerning which compression method to use. Such an arrangement can ensure that the most advantageous compression methodology is being applied with respect to each frame of data that is communicated.

For example, a compression methodology chosen for a particular frame could be based on a determination as to which compression method (spatial, temporal, both) provides the highest compression ratio for the set of data that is currently being communicated in that frame. Of course, there are some drawbacks to this approach which may make it unsuitable for certain implementations. For example, a communication frame in such a scenario would need extra overhead to notify the receiving device of the decompression rule which is to be applied for recovering the original data.

Figure 7:
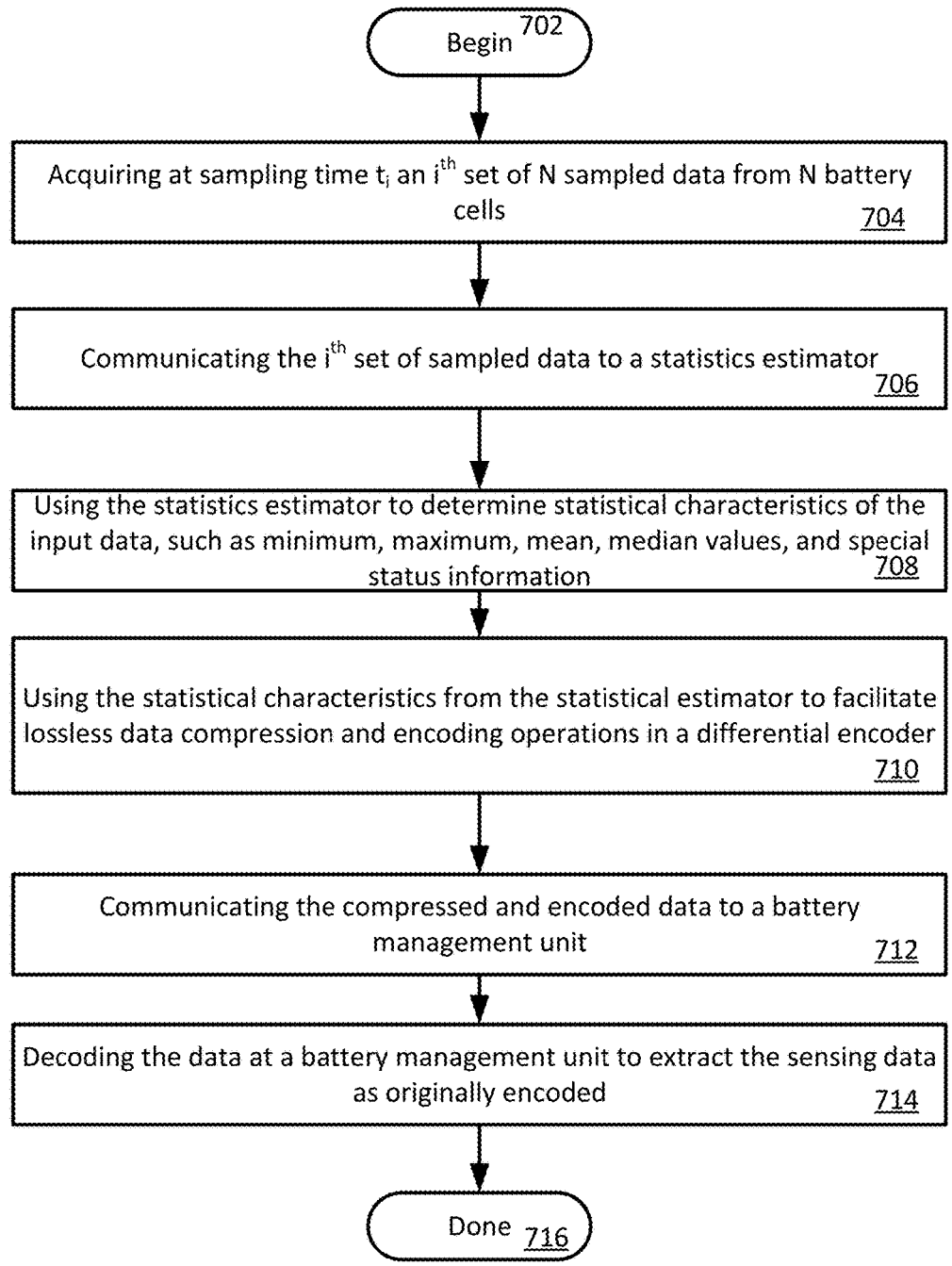
FIG. 7 is a flowchart which is useful for understanding a process flow for data compression in a spatial domain.

A process as described herein which utilizes spatial data compression is illustrated in FIG. 7. The process can begin at 702 and continues to 704 where an $i^{th}$ set of sampled data is acquired from N monitored elements (e.g., N battery cells 102). The data set is communicated at 706 to a statistics estimator (e.g., statistics estimator 404). The statistics estimator uses the data at 708 to determine one or more statistical characteristics of the input data, such as minimum, maximum, mean, median values and special status information. At 710 the statistical characteristics from the statistical estimator are used to facilitate lossless data compression and encoding operations in a differential encoder. In the scenario shown in FIG. 7 the compression operations at 710 are performed in the spatial domain. Thereafter, the compressed and encoded data is communicated in one or more data frames to a receiving entity (e.g. a battery management unit). At 714, the receiving unit extracts the sensing data as originally encoded by applying a decoding/decompression rule.

Figure 8:
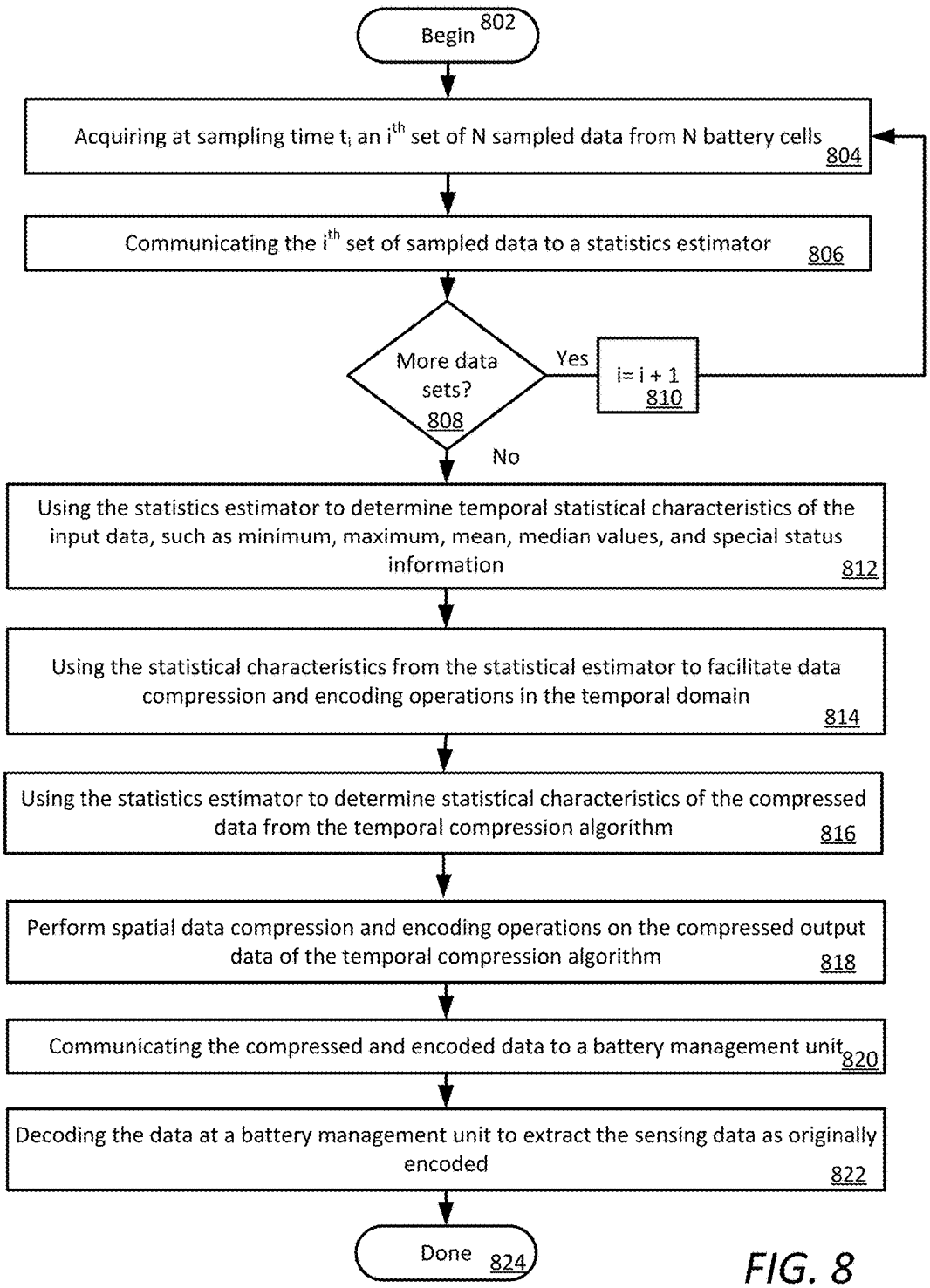
FIG. 8 is a flowchart which is useful for understanding process flow for data compression in both the temporal and spatial domain.

A process as described herein which utilizes both temporal and spatial data compression is illustrated in FIG. 8. The process can begin at 802 and continues to 804 where an $i^{th}$ set of sampled data is acquired from N monitored elements (e.g., N battery cells 102). The data set is communicated at 806 to a statistics estimator (e.g., statistics estimator 404). At 808 a determination is made as to whether a sufficient number of data sets have been acquired to facilitate temporal data compression. If not, the value of i is incremented at 810 and the process returns to 804, 806 where additional data sets are acquired and sent to the statistics estimator. Once it is determined that sufficient data sets have been acquired to facilitate temporal data compression (808: Yes), the process continues on to 812.

At the statistics estimator the acquired data sets are processed at 812 to determine one or more temporal statistical characteristics of the input data, such as minimum, maximum, mean, median values and special status information. At 814 the statistical characteristics from the statistical estimator are used to facilitate lossless data compression and encoding operations in the temporal domain. At 816 a second statistics estimator is used to determine statistical characteristics of the compressed data from the temporal compression algorithm. At 818, spatial data compression and encoding operations are performed on the compressed output data of the temporal compression algorithm. Thereafter, at 820 the compressed and encoded data is communicated in one or more data frames to a receiving entity (e.g. a battery management unit). At 822, the receiving unit extracts the sensing data as originally encoded by applying decoding/decompression rules which are the inverse of the encoding operations.

The process shown in FIG. 8 shows a scenario in which temporal data compression is performed before spatial data compression. However, it should be appreciated that embodiments are not limited in this regard and in other scenarios spatial compression can be performed first, followed by temporal data compression.

Systems for carrying out the embodiments of the sensor module 106 and battery management unit 108 described herein can comprise one or more components such as a processor, an application specific circuit, a programmable logic device, a digital signal processor, or other circuit programmed to perform the functions described herein. Embodiments can be realized in one computer system or several interconnected computer systems. Any kind of computer system or other apparatus adapted for carrying out the methods described herein is suited.

Figure 9:
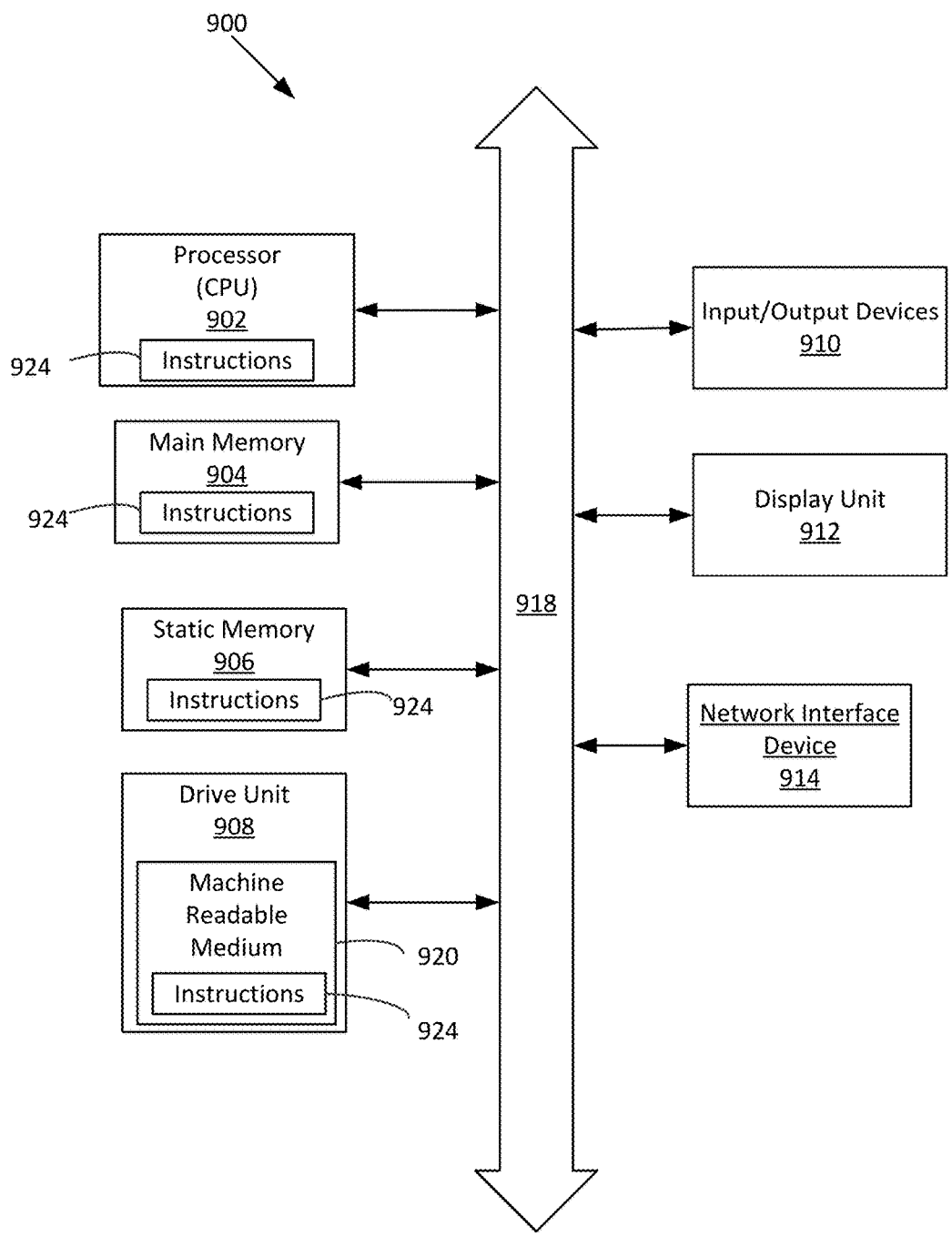
FIG. 9 is a block diagram that is useful for understanding a sensor module and a battery management unit discussed herein.

Referring now to FIG. 9, there is shown a hardware block diagram comprising an exemplary computer system 900 which is sufficient for understanding an implementation of a sensor module 106 and/or a battery management unit 108. The machine can include a set of instructions which are used to cause the computer system to perform any one or more of the methodologies discussed herein. The computer system 900 can be operatively connected (networked) to other machines in a distributed environment to facilitate certain operations described herein.

The computer system 900 is comprised of a processor 902 (e.g. a central processing unit or CPU), a main memory 904, a static memory 906, input/output devices 910. In some scenarios, the computer system 900 can include a display unit 912 (e.g. a liquid crystal display (LCD), a solid state display, or a cathode ray tube (CRT)), and a network interface device 914. The computer system can also include a drive unit 908 for mass data storage and comprised of machine readable media 920. Communications among these various components can be facilitated by means of a data bus 918. One or more sets of instructions 924 can be stored completely or partially in one or more of the main memory 904, static memory 906, and drive unit 908. The instructions can also reside within the processor 902 during execution thereof by the computer system. The input/output devices 910 can include a keyboard, a mouse, a multi-touch surface (e.g. a touchscreen) and so on. The network interface device 914 can be comprised of hardware components and software or firmware to facilitate wired or wireless network data communications in accordance with a network communication protocol utilized by a data network 110.

The drive unit 908 can comprise a machine readable medium 920 on which is stored one or more sets of instructions 924 (e.g. software) which are used to facilitate one or more of the methodologies and functions described herein. The term "machine-readable medium" shall be understood to include any tangible medium that is capable of storing instructions or data structures which facilitate any one or more of the methodologies of the present disclosure. Exemplary machine-readable media can include magnetic media, solid-state memories, optical-media and so on. More particularly, tangible media as described herein can include; magnetic disks; magneto-optical disks; CD-ROM disks and DVD-ROM disks, semiconductor memory devices, electrically erasable programmable read-only memory (EEPROM)) and flash memory devices. A tangible medium as described herein is one that is non-transitory insofar as it does not involve a propagating signal.

Computer system 900 should be understood to be one possible example of a computer system which can be used in connection with the various implementations disclosed herein. However, the systems and methods disclosed herein are not limited in this regard and any other suitable computer system architecture can also be used without limitation.

For example, in many scenarios dedicated hardware implementations may be more appropriate for implementing the sensor module and/or battery management unit described herein. These dedicated hardware implementations can include, but are not limited to, application-specific integrated circuits, programmable logic arrays, and other hardware devices which can likewise be constructed to implement the methods described herein. Applications that can include the apparatus and systems of various embodiments broadly include a variety of electronic and computer systems. Some embodiments may implement functions in two or more specific interconnected hardware modules or devices with related control and data signals communicated between and through the modules, or as portions of an application-specific integrated circuit. Thus, the exemplary system is applicable to software, firmware, and hardware implementations.

Further, it should be understood that embodiments can take the form of a computer program product on a tangible computer-usable storage medium (for example, a hard disk or a CD-ROM). The computer-usable storage medium can have computer-usable program code embodied in the medium. The term computer program product, as used herein, refers to a device comprised of all the features enabling the implementation of the methods described herein. Computer program, software application, computer software routine, and/or other variants of these terms, in the present context, mean any expression, in any language, code, or notation, of a set of instructions intended to cause a system having an information processing capability to perform a particular function either directly or after either or both of the following: a) conversion to another language, code, or notation; or b) reproduction in a different material form.

Reference throughout this specification to features, advantages, or similar language does not imply that all of the features and advantages that may be realized should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout the specification may, but do not necessarily, refer to the same embodiment.

Furthermore, the described features, advantages and characteristics disclosed herein may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments.

Reference throughout this specification to "one embodiment", "an embodiment", or similar language means that a particular feature, structure, or characteristic described in connection with the indicated embodiment is included in at least one embodiment. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the embodiments have been illustrated and described with respect to one or more implementations, equivalent alterations and modifications will occur to others skilled in the art upon the reading and understanding of this specification and the annexed drawings. In addition, while a particular feature of an embodiment may have been disclosed with respect to only one of several implementations, such feature may be combined with one or more other features of the other implementations as may be desired and advantageous for any given or particular application. Thus, the breadth and scope of the embodiments disclosed herein should not be limited by any of the above described embodiments. Rather, the scope of the invention should be defined in accordance with the following claims and their equivalents.

We claim:

1. A method for spatial-temporal compression of sensing data from a plurality of battery sensors in a battery management system, comprising:
using a plurality of N battery sensors to respectively obtain measured physical data associated with a plurality of N battery cells;
acquiring at each of a plurality of sampling times a set of N sampled data from the N battery cells corresponding to the measured physical data;
analyzing the sets of N sampled data acquired at the plurality of sampling times to obtain statistical characteristic information for one or more of the sets of N sampled data; and
obtaining at least one frame of compressed data using the statistical characteristic information in a differential encoding process to facilitate at least one of temporal and spatial data compression of the one or more sets of N sampled data acquired at the plurality of sampling times, wherein at least one of a temporal and a spatial domain characteristic of the N battery cells facilitate lossless data compression.

2. The method according to claim 1, wherein the statistical characteristic information comprises one or more selected from a group consisting of minimum, mean, and median data values.

3. The method according to claim 2, wherein the statistical characteristic information further comprises special status information indicating an abnormal condition of the battery cell.

4. The method according to claim 1, wherein the differential encoding process comprises reference-based differential block coding (RDBC).

5. The method according to claim 1, further comprising communicating the at least one frame of compressed data to a remote data receiver, and decompressing the at least one frame of compressed data to recover the one or more sets of N sampled data obtained from each of the plurality of sampling times.

6. The method according to claim 1, where the measured physical data is battery cell voltage data.

7. The method according to claim 1, where the physical data is selected from group consisting of battery cell voltage, battery cell temperature, and battery cell current data.

8. The method according to claim 7, wherein the remote data receiver comprises a battery management unit configured to monitor a status of the plurality of N battery cells.

9. The method according to claim 1, wherein a spatial domain for purposes of the spatial data compression is defined by the set of N sampled data from the N battery cells at a certain sampling time, and a temporal domain for purposes of temporal data compression is defined by a set of sampled data from a same battery sensor at different sampling times.

10. The method according to claim 9, wherein the differential encoding process includes both the temporal data compression and the spatial data compression of the one or more sets of N sampled data.

11. The method according to claim 10, wherein the differential encoding process comprises data compression in the temporal domain followed by data compression in the spatial domain.

12. The method according to claim 9, further comprising dynamically varying the differential encoding process to include a data compression type selected from a group consisting of temporal data compression, spatial data compression, and a combination of temporal and spatial data compression.

13. The method according to claim 12, wherein the dynamic variation of the differential encoding process is performed so as to maximize a compression ratio of each said frame while also ensuring lossless data transmission.

14. A method for spatial-temporal compression of battery data obtained from a multiplicity of battery sensors associated with a battery management system, comprising:
using a plurality of N battery sensors to respectively obtain measured physical data associated with a plurality of N battery cells;
acquiring at each of a plurality of sampling times a set of N sampled data from the N battery cells corresponding to the measured physical data;
obtaining at least one frame of compressed data using a reference-based differential block coding (RDBC) process to facilitate at least one of temporal and spatial data compression of one or more sets of N sampled data acquired at the plurality of sampling times;
communicating the at least one frame of compressed data to a battery management unit configured to monitor a status of the multiplicity of battery cells, and decompressing the at least one frame of compressed data to recover the one or more sets of N sampled data obtained from each of the plurality of sampling times;
wherein a spatial domain for purposes of the spatial data compression is defined by the set of N sampled data from the N battery cells at a certain sampling time, and a temporal domain for purposes of temporal data compression is defined by a set of sampled data from a same battery sensor at different sampling times.

15. The method according to claim 14, where the measured physical data is selected from a group consisting of a battery cell voltage, a battery cell temperature, and a battery cell current data.

16. The method according to claim 14, wherein the RDBC process comprises data compression in the temporal domain followed by data compression in the spatial domain.

17. The method according to claim 14, further comprising dynamically varying the RDBC process to facilitate a data compression type selected from a group consisting of temporal data compression, spatial data compression, and a combination of temporal and spatial data compression.

18. The method according to claim 17, wherein the dynamic variation of the RDBC process is performed so as to maximize a compression ratio of each said frame while also ensuring lossless data transmission.

19. The method according to claim 14, wherein at least one of a temporal and a spatial domain characteristic of the N battery cells facilitates lossless data compression.

* * * * *

UNITED STATES PATENT AND TRADEMARK OFFICE
CERTIFICATE OF CORRECTION

PATENT NO.         : 10,435,869 B2                                          Page 1 of 1
APPLICATION NO.    : 15/850734
DATED              : October 8, 2019
INVENTOR(S)        : Inseop Lee et al.

It is certified that error appears in the above-identified patent and that said Letters Patent is hereby corrected as shown below:

On the Title Page

Please replace the name of the Assignee "Navilas Solutions, Inc." with the correct name "Navitas Solutions, Inc.".

Signed and Sealed this
Seventeenth Day of March, 2020

Andrei Iancu
*Director of the United States Patent and Trademark Office*